United States Patent [19]

Takenaka et al.

[11] Patent Number: 5,265,118

[45] Date of Patent: Nov. 23, 1993

[54] SILICON CARBIDE WHISKER PRODUCTION APPARATUS

[75] Inventors: Takashi Takenaka, Fujisawa; Shigeto Mori, Chigasaki; Osamu Machida, Odawara, all of Japan

[73] Assignee: Tokai Carbon Co., Ltd., Tokyo, Japan

[21] Appl. No.: 853,189

[22] Filed: Mar. 18, 1992

[30] Foreign Application Priority Data

Mar. 22, 1991 [JP] Japan .................................. 3-83215

[51] Int. Cl.$^5$ .............................................. H05B 3/62
[52] U.S. Cl. ...................................... 373/117; 373/27; 373/29; 373/120; 373/123; 373/115; 373/130; 373/132; 422/199; 422/191; 422/166; 423/345; 423/348
[58] Field of Search .......................... 373/27, 29, 30, 31, 373/36, 132, 9, 120, 93, 123, 115, 114, 130, 88, 117; 423/348, 345, 349, 350; 422/166, 199, 191

[56] References Cited

U.S. PATENT DOCUMENTS

| 3,737,553 | 6/1973 | Kreider et al. | 373/130 |
| 3,798,417 | 3/1974 | Bittner | 219/532 |
| 3,812,276 | 3/1974 | Cyrway et al. | 373/130 |
| 3,860,222 | 1/1975 | Tennenhouse | 432/205 |
| 3,950,602 | 4/1976 | Korsten et al. | 373/114 |
| 4,141,539 | 2/1979 | Bornor | 266/78 |
| 4,233,494 | 11/1980 | Pawlik et al. | 219/382 |
| 4,278,421 | 7/1981 | Limque et al. | 432/152 |
| 4,292,276 | 9/1981 | Enomoto et al. | 422/199 |
| 4,490,828 | 12/1984 | Fukuhara et al. | 373/117 |
| 4,514,167 | 4/1985 | Royer | 432/11 |
| 4,559,631 | 12/1985 | Moller | 373/130 |
| 4,560,348 | 12/1985 | Moller et al. | 432/77 |
| 4,612,651 | 9/1986 | Moller et al. | 373/130 |
| 4,771,166 | 9/1988 | McGuire et al. | 219/532 |
| 4,789,333 | 12/1988 | Hemsath | 432/176 |
| 4,799,881 | 1/1989 | Grier et al. | 432/77 |
| 4,906,182 | 3/1990 | Moller | 432/77 |
| 4,915,924 | 4/1990 | Nadkarni et al. | 423/345 |
| 4,970,372 | 11/1990 | Fleiter et al. | 219/400 |
| 4,992,245 | 2/1991 | Van Slooten et al. | 422/146 |
| 5,035,611 | 7/1991 | Neubecker et al. | 432/176 |
| 5,055,276 | 10/1991 | Huckins | 422/191 |
| 5,119,395 | 6/1992 | Hemsath et al. | 373/112 |

FOREIGN PATENT DOCUMENTS

| 48-93600 | 12/1973 | Japan . |
| 58-145700 | 8/1983 | Japan . |
| 62-3099 | 1/1987 | Japan . |
| 62-3099 | 1/1987 | Japan . |

OTHER PUBLICATIONS

"Application of Vacuum Heat Treatment to Tool and Die Material" James G. Conybear Conference on Effective Tooling Methods and Selection and Treatment of Tool Steels.
"High Pressure Quench" Vacuum Furnace product brochure, Abar Ipsen Industries.
"Progress in Design and Use of Vacuum Furnaces with High Pressure Gas Quench Systems" by Abar Ipsen's Technical Reports No. Jan. 1988.
"Industrial Furnace Systems" GM Enterprises product brochure.

Primary Examiner—Bruce A. Reynolds
Assistant Examiner—Tu Hoang
Attorney, Agent, or Firm—Armstrong, Westerman, Hattori, McLeland & Naughton

[57] ABSTRACT

A silicon carbide whisker production apparatus manufactured by placing a plurality of lidded reaction vessels in the longitudinal direction of an Acheson furnace at intervals, packing graphite grains in the gaps between the adjacent reaction vessels and around the reaction vessels along the longitudinal direction of the furnace starting with the furnace-side ends of terminal electrodes to form a surrounding heating zone, and packing a heat insulating packing around the surrounding heating zone.

4 Claims, 1 Drawing Sheet

SILICON CARBIDE WHISKER PRODUCTION APPARATUS

BACKGROUND OF THE INVENTION

The present invnetion relates to an Acheson furnace type silicon carbide whisker production apparatus.

Techniques for producing silicon carbide whisker useful as a composite reinforcement are broadly classified into a gas phase synthetic process and a solid phase synthetic process.

The gas phase synthetic process comprises thermally decomposing in a hydrogen gas stream, for example, a gaseous mixture of a silicon halide compound with a hydrocarbon, or carbon and a halogenated organosilicon compound.

In this gas phase synthetic process, however, since the halogenated compound used as the starting material is detrimental to health, the handling therof is attended with unfavorable danger.

In the solid phase synthetic process, a mixture of a powdery silicon source component with a carbon component is used as the starting material, while no halogenated compound is used as the starting material, so that the handling of the starting material is not attended with danger. Further, since the substance to be used as the starting material is available at a low cost, this process is currently practiced as an industrial production means.

Examples of the apparatus used for heating and reacting the above-described mixture as the starting material include an Acheson furnace type reactor (see, for example, Japanese patent application Kokai publications No. 48-93600 and No. 58-145700) and a tubular reactor provided with an electric heater or a high frequency induction heating means (see, for example, Japanese patent application Kokai publication No. 62-3099).

The Acheson furnace type reactor is an apparatus used for heating a plurality of reaction vessels packed with the starting material in a furnace. Therefore, in this apparatus, only batch production is possible and no continuous operation can be conducted. Further, in each reaction vessel packed with the starting material, it is difficult to uniformly heat the apparatus to a desired temperature.

In contrast, the tubular reactor wherein an electric heater is used as a heating source is an apparatus wherein the reaction vessels packed with the starting material are successively sent into the furnace so as to continuously produce silicon carbide whisker. Therefore, the mass productivity is superior to the batch-wise Acheson furnace type reactor.

The tubular reactor, however, gives rise to unfavorable phenomena during the operation, such as deterioration in the insulation of the heater, the burnout of the heater, and consumption of the heater to a minute extent. In each time, the operation should be stopped to repair the heater, so that normal operation is inhibited.

Further, when an improvement in the efficiency of uniform heating and an increase in the size of the equipment are intended in the electric heating tubular reactor, it is necessary to increase the number of heaters provided, which gives rise to an increase in the cost of the equipment and an unfavorable increase in the frequency of failure.

SUMMARY OF THE INVENTION

A first object of the present invention is to provide an Acheson furnace type silicon carbide whisker production apparatus which can be readily enlarged and is less susceptible to failure.

A second object of the present invention is to provide an Acheson furnace type silicon carbide whisker production apparatus which is excellent in the capability of uniform heating operability and mass productivity.

These objects of the present invention can be attained by a silicon carbide whisker production apparatus manufactured by placing a plurality of lidded reaction vessels at intervals in the longitudinal direction of an Acheson furnace, packing graphite grains in the gaps between the adjacent reaction vessels and around the reaction vessels along the longitudinal direction of the furnace starting with the furnace-side ends of terminal electrode to form a surrounding heating zone, and packing a heat insulating packing around the surrounding heating zone.

PREFERRED EMBODIMENTS

Figure 1:
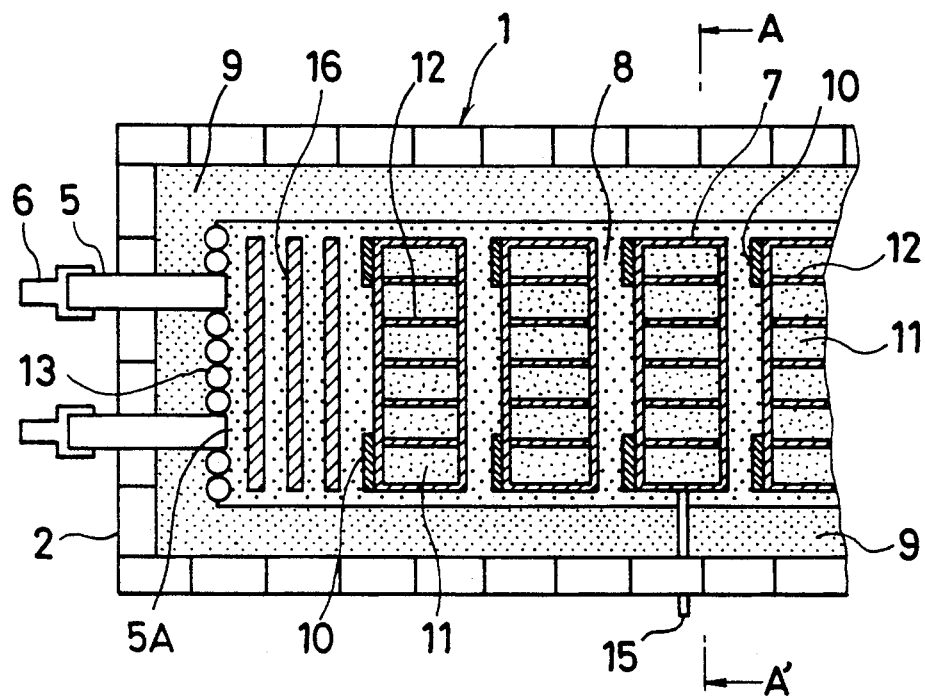
FIG. 1 is a partial sectional view of the silicon carbide whisker production apparatus according to the present invention.
Figure 2:
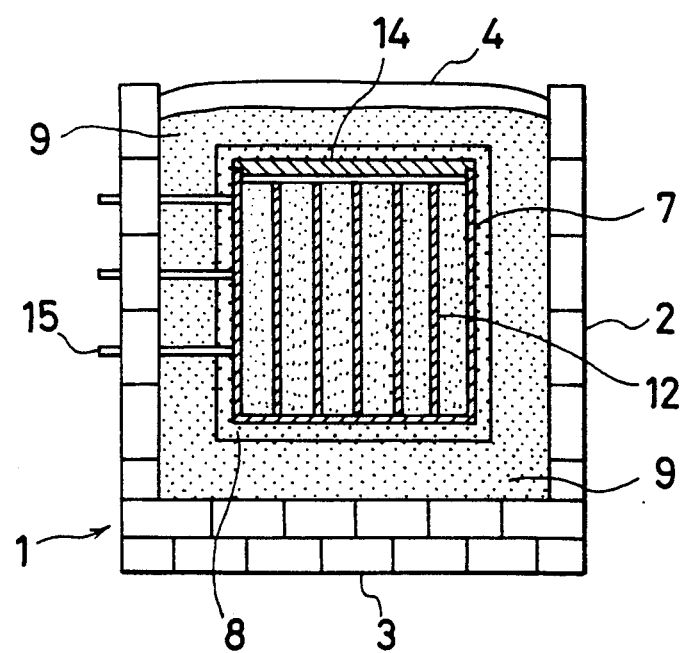
FIG. 2 is a cross-sectional view of the apparatus of the present invention taken along line A—A' of FIG. 1.

The present invention will now be described in more detail with reference to FIGS. 1 and 2.

The silicon carbide whisker production apparatus according to the present invention is an Acheson furnace type reaction furnace 1. The reaction furnace 1 is composed of a furnace wall 2, a hearth 3 and a shielding material 4, and the end of the furnace 1 is provided with a plurality of terminal electrodes 5 inserted through the furnace wall 2. A conductor 6 is attached to each terminal electrode 5.

A plurality of lidded reaction vessels 7 are provided at intervals within the reaction furnace 1, and graphite grains are packed between the furnace side end 5A of each terminal electrode 5 and the reaction vessel 7, in the gaps between the adjacent reaction vessels and around the reaction vessels to form a surrounding heating zone 8 along the longitudinal direction of the furnace starting with the furnace-side ends 5A of the terminal electrodes 5.

Further, a heat insulating packing 9 is packed around the surrounding heating zone 8, and a shielding material 4 is placed on the furnace 1.

There is no particular limitation on the material for the furnace wall 2 and the hearth 3, and the material for the conventional Acheson furnace may be used. The shielding material 4 is not indispensable and may be used according to need. The vessel 7 is made from graphite material and may be in any form. In general, a square box type or round reaction vessel is used because of the ease of manufacture. In the case of a rectangular box type reaction vessel, as shown in FIG. 1, each reaction vessel 7 is disposed so that the longer side thereof is disposed in the widthwise direction of the furnace 1 and the distance from the heating source is uniform to conduct uniform heating. The gap between the adjacent reaction vessels may be arbitrarily selected. Although the gaps may be different from each other, it is preferable in order to uniformly heat the starting material mixture 11 within each reaction vessel 7 that the reaction vessels 7 be placed at equal intervals, for examples, at intervals of 50 to 200 mm. The face of each reaction vessel 7 opposite to the terminal electrodes 5 is preferably disposed perpendicularly to the axis of the furnace for the purpose of uniformly heating the starting material mixture 11. The lid 14 is one made from graphite.

In order to prevent a lowering in the temperature of both ends of the face of the reaction vessel 7 opposite to the terminal electrodes 5 due to heat radiation to the furnace wall 2, it is preferred to attach a graphite piece 10 for uniform heating on each end of the face of each reaction vessel 7 opposite to the terminal electrodes 5.

In order to more uniformly heat the starting material 11 packed in each reaction vessel 7, it is preferred to provide within each reaction vessel 7 heat conducting graphite plates 12 so as to divide the vessel 7 into a plurality of parts along the longitudinal direction of the furnace 1. The interval between the adjacent heat conducting plates 12 is preferably 100 mm or less. When the interval exceeds 100 mm, it becomes difficult to sufficiently uniformly heat the starting material 11.

Further, the capability of uniformly heating the starting material 11 can be further improved when one or more graphite plates 16 for uniform heating, each having the same area as that of the side face, are provided in the widthwise direction of the furnace 1 of the reaction vessel 7 and between the terminal electrodes 5 and the reaction vessel 7, and graphite rods 13 of the same type are arranged in an area corresponding to the plate 16 so as to abut against the terminal electrodes and against each other.

The graphite grains constituting the surrounding heating zone 8 are preferably those well classified to have an equal grain size, a preferable grain size being in the range of from 5 to 10 mm.

The heat insulating packing 9 comprises at least one member selected from the group consisting of graphite powder, carbon black and ceramic wool.

The temperature of the furnace 1 is measured with temperature sensors 15 inserted into the furnace 1 through the furnace wall 2.

Silicon carbide whisker is produced on the silicon carbide whisker production apparatus according to the present invention by packing the reaction vessels 7 with the starting material 11 prepared by mixing a silicon component, for example, quartz sand, silica gel or chaff, a carbon component, for example, carbon black, and a catalyst, for example, a chloride or an oxide of iron, nickel, cobalt or calcium, placing the lid 14 on each reaction vessel 7, covering the periphery of each vessel with the surrounding heating zone 8 and the heat insulating packing 9, and energizing the terminal electrodes 5 for heating, thereby allowing the components of the starting material 11 to react with each other. After the completion of the reaction, the surrounding heating zone 8 and the heat insulating packing 9 covering the reaction vessels 7 are removed, and the lids 14 are opened. The reaction product is recovered through the use of a suction tube. Subsequently, a fresh starting material system is packed in the reaction vessels to repeat the above-described procedure.

Thus, according to the silicon carbide whisker production apparatus of the present invention, the apparatus can be operated with a very high operation efficiency despite the batch process, so that the production efficiency of silicon carbide whisker can be enhanced.

In general, in an Acheson furnace, even when a low-voltage large current is flowed into the furnace from the terminal electrodes, the object is heated mainly through the resistance heat buildup of the heat insulating packing present in the current passage.

Therefore, the heat source which contributes to the heating depends upon the resistance heat buildup of the heat insulating packing, and the heating value is greatly influenced by the size of the gap.

On the other hand, according to the silicon carbide whisker production apparatus of the present invention, since a surrounding heating zone comprising graphite grains having an even grain size and an excellent heat conductivity fills and covers the gaps between the adjacent reaction vessels and the peripheries of the vessels, the gap resistance heat is indirectly transferred to the reaction vessels through the graphite layer.

The above-described indirect heat transfer can well reduce the positional temperature distribution difference in the vessels and the variation in the temperature rise rate, thus attaining an excellent effect of uniform heating.

The variation in the size of the graphite grain and the thickness of the grain layer serves to control the temperature distribution and the heat buildup area easily.

Therefore, the above-described action of uniform heating allows uniform heating of the starting material system as a whole within each reaction vessel, so that silicon carbide whisker having good uniform properties can be produced in a high yield.

Further, the Acheson furnace type silicon carbide whisker production apparatus has advantages that the equipment can be more easily enlarged than the silicon carbide whisker production apparatus wherein use is made of an electric heater, the heat source is less liable to give rise to failure and the inside of the furnace can be inevitably maintained in a nonoxidizing atmosphere.

An example of the production of silicon carbide whisker according to the apparatus of the present invention will now be described.

EXAMPLE

Four graphite plates for uniform heating, each having a length of 70 mm, a width of 400 mm and a depth of 1800 mm, were provided at equal intervals of 50 mm perpendicularly to the terminal electrodes in an Acheson furnace having an inner dimension of a length of 18 m, a width of 2.82 m and a depth of 3.07 m. 59 rectangular box type graphite reaction vessels, each having a length of 225 mm, a width of 1600 mm and a depth of 1800 mm, were arranged in the furnace at equal intervals of 50 mm so as to oppose the terminal electrodes through these graphite plates. A graphite piece for uniform heating having a thickness of 10 mm, a width of 400 mm and a length of 400 mm was provided on each end of the outer side of the vessels opposite to the terminal electrodes, and heat conducting graphite plates (thickness: 15 mm) were provided at interval of 80 mm in each vessel so as to divide the vessel into a plurality of parts in the longitudinal direction of the furnace.

Silica gel powder, carbon black and cobalt chloride were mixed with each other in a molar ratio of 2:9:0.02 to prepare a starting material. This starting material is packed in each reaction vessel, and a lid is put thereon. The gaps between the adjacent reaction vessels and the peripheries of the reaction vessels are packed and covered with graphite grains having a grain size of 5 to 10 mm in a layer thickness of 50 mm to form a surrounding heating zone.

Silicon carbide whisker was produced through the use of an apparatus having the above-described structure.

Specifically, the terminal electrodes were energized to raise the temperature of the vessels from room temperature to 1700 °C. at a temperature rise rate of 3° C./min, and the temperature was maintained at 1700° C. for 2 hr to produce silicon carbide whisker.

The properties of the obtained whisker are given in Table 1.

COMPARATIVE EXAMPLE

A test for a comparison with the above-described Example was conducted through the use of a closed electric furnace provided with a plurality of silicon carbide heaters on the periphery of the furnace.

Specifically, the same starting material as that used in the Example was placed in a reaction vessel having the same configuration as that of the reaction vessel used in the Example. Silicon carbide whisker was produced at a reaction temperature of 1700° C. while maintaining the inside of the system in an argon atmosphere.

The properties of the resultant whisker are also given in Table 1.

TABLE 1

| Properties | Ex. | Comp. Ex. |
| --- | --- | --- |
| type of crystal | β | β |
| average diameter (μm) | 0.5 | 0.3 |
| average length (μm) | 8.2 | 4.0 |
| aspect ratio | 16 | 13 |
| density (g/cm$^3$) | 3.22 | 3.22 |
| SiC content (wt. %) | 97 | 82 |
| contamination with particulate substance | a little | much |
| shape | good | poor |

It is apparent from the results shown in Table 1 that in case of the same large reaction vessel, the Example wherein use was made of the silicon carbide whisker production apparatus according to the present invention can provide silicon carbide having better properties in a higher yield than those of the Comparative Example wherein use was made of a silicon carbide whisker production apparatus provided with electric heaters.

What is claimed is:

1. A silicon carbide whisker production apparatus comprising a furnace having a longitudinal direction and terminal electrodes extending through a wall of the furnace, a plurality of lidded reaction vessels at intervals in the longitudinal direction of the furnace, graphite grains packed in gaps between adjacent reaction vessels and around said reaction vessels along the longitudinal direction of the furnace to form a surrounding heating zone, and a heat insulating packing around said surrounding heating zone.

2. A silicon carbide whisker production apparatus comprising a furnace having a longitudinal direction and terminal electrodes extending through a wall of the furnace, a plurality of lidded reaction vessels at intervals in the longitudinal direction of the furnace, both ends of a side surface of each said reaction vessel which face said terminal electrodes provided with graphite pieces for uniform heating, graphite grains packed in gaps between adjacent reaction vessels and around said reaction vessels along the longitudinal direction of the furnace heating zone, and a heat insulating packing around said surrounding heating zone.

3. A silicon carbide whisker production apparatus comprising a furnace having a longitudinal direction and terminal electrodes extending through a wall of the furnace, a plurality of lidded reaction vessels at intervals in the longitudinal direction of the furnace, at least one graphite plate for uniform heating which has an area equal to an area of a side surface of said reaction vessels which face said terminal electrodes provided between said terminal electrodes and said reaction vessels so as to oppose the terminal electrodes, graphite grains packed in gaps between adjacent reaction vessels and around said reaction vessels along the longitudinal direction of the furnace to form a surrounding heating zone, and a heat insulating packing around said surrounding heating zone.

4. A silicon carbide whisker production apparatus according to claim 3, wherein a plurality of graphite rods are provided which abut against said terminal electrodes and against each other are in parallel with said graphite plate for uniform heating, and have an area corresponding to said graphite plate.

* * * * *